United States Patent [19]

Yonezuka et al.

[11] 3,851,223

[45] Nov. 26, 1974

[54] MICROCIRCUIT BOARD

[75] Inventors: Masayasu Yonezuka; Hiroshi Murata, both of Tokyo, Japan

[73] Assignee: Nippon Electric Company Limited, Tokyo, Japan

[22] Filed: Nov. 21, 1972

[21] Appl. No.: 308,465

[30] Foreign Application Priority Data

Dec. 6, 1971 Japan ................................ 46-98883

[52] U.S. Cl. ........... 317/101 CC, 29/626, 174/68.5, 339/17 C

[51] Int. Cl. ............................................ H05k 3/34

[58] Field of Search . 174/68.5; 317/101 B, 101 CC, 317/101 CM, 234 J; 29/626; 339/17 R, 17 C, 17 CF, 275 B

[56] References Cited

UNITED STATES PATENTS 3,429,040 2/1969 Miller ........................... 174/68.5 X

*Primary Examiner*—Darrell L. Clay
*Attorney, Agent, or Firm*—Sandoe, Hopgood & Calimafde

[57] ABSTRACT

A microcircuit board for use with integrated circuits includes at least one thin film land to which components are to be soldered. The land is divided into solderable and nonsolderable areas, and the amount of solder that is preliminarily applied to the land will be determined by the ratio of the solderable areas to the non-solderable areas.

3 Claims, 5 Drawing Figures

MICROCIRCUIT BOARD

BACKGROUND OF THE INVENTION

This invention relates generally to microcircuit boards, and more particularly to a microcircuit board to which several circuit elements are soldered.

Hybrid integrated circuits which are widely utilized for electronic instruments are provided with many types of circuit elements which are connected to each other by several connecting methods. Among the most popular of these connecting methods is to solder the circuit elements on hybrid integrated circuit boards.

In order to miniaturize the hybrid integrated circuit to the greatest possible extent, the integrated circuits should be arranged to be as compact as possible. In the fabrication of integrated circuits having flat plate electrodes, erroneous connection between areas of the integrated circuits resulting from solder occurs frequently. Therefore, the amount of solder placed upon the thin film land of the hybrid integrated circuit board to which flat plate electrode parts are to be connected should be moderately reduced. On the other hand, the amount of solder placed upon the thin film lands which are used for lumped constant circuit elements, such as capacitors and resistors, must be sufficient to ensure the proper connection of these elements.

Thus, in forming a hybrid integrated circuit assembly, the amount of solder that is preliminarily applied to the thin film lands should be varied according to the circuit elements that are to be connected thereto. However, it is not possible to provide such a difference in the amount of preliminary solder applied to different areas of the same integrated circuit board by the use of a conventional wave soldering machine, and such a machine is considered to be the best equipment for carrying out preliminary soldering on a hybrid integrated circuit board with respect to performance and quality.

In a conventional integrated circuit board fabricating process, solder is first applied uniformly to the entire hybrid integrated circuit board by a wave soldering machine, and excess solder at the sections where the flat plate electrode parts are to be connected is then removed by using a solder absorber. This method has, however, the following disadvantages: (1) The operating performance efficiency is poor; (2) The amount of solder used tends to be varied according to the skill of the operator; and (3) The thin films are frequently diffused into the solder during the absorbing process to impair the bonding force of the solder.

It is, therefore, an object of the present invention to provide an improved hybrid integrated circuit board which is free of the above-mentioned defects of the conventional structures and which permits the preliminary application of solder with any desired amounts of solder.

A thin film circuit such as a hybrid integrated circuit is generally composed of a composite film of tantalum, nichrome, and gold layers laid on a ceramic base, or a composite film of tantalum, titanium, palladium, and gold layers laid on a ceramic base in that order, with the topmost layer being a metal film that is most receptive to soldering. In the microcircuit board of the present invention, the solderable area is partially decreased in those film lands to which circuit elements requiring an adjustment of the amount of preliminary soldering are to be connected.

DESCRIPTION OF THE DRAWINGS

The present invention will be explained in detail referring to the attached drawings, wherein.

DESCRIPTION OF THE INVENTION

Figure 1:
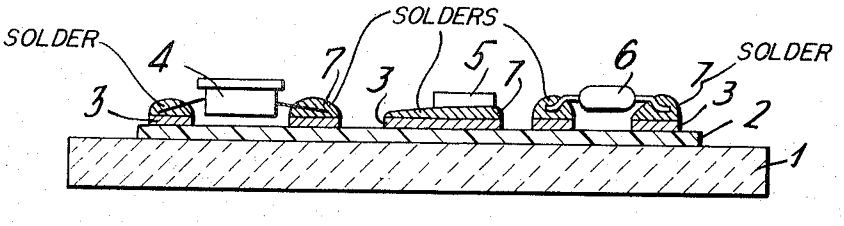
FIG. 1 is a sectional view of a hybrid integrated circuit assembly including several circuit elements connected to a hybrid integrated circuit board.

Referring to FIG. 1, a hybrid integrated circuit assembly comprises a ceramic base 1 on which a resistor film 2 is formed. A plurality of conductor films 3 are formed at selected locations on the upper surface of film 2. An electrical component 4 having ribbon-shaped lead terminals, such as a flat back transistor, a flat plate electrode part 5 having an entire surface which is utilized as a terminal, such as a ceramic capacitor, and a lumped constant element 6 such as a resistor, are all connected to the selected ones of the conductor films 3 by a quantity of solder 7. In connecting components, and particularly a component having a flat plate electrode such as 5, it is essential that the amount of solder applied on the film 3 be reduced so as to prevent short-circuiting between the upper and lower electrodes of the component due to excess solder. On the other hand, when components other than components having flat plate electrodes are attached, the lead wires of these components must be perfectly covered with solder so that the amount of solder applied on each film land must be adequate.

Figures 2A, 2B:
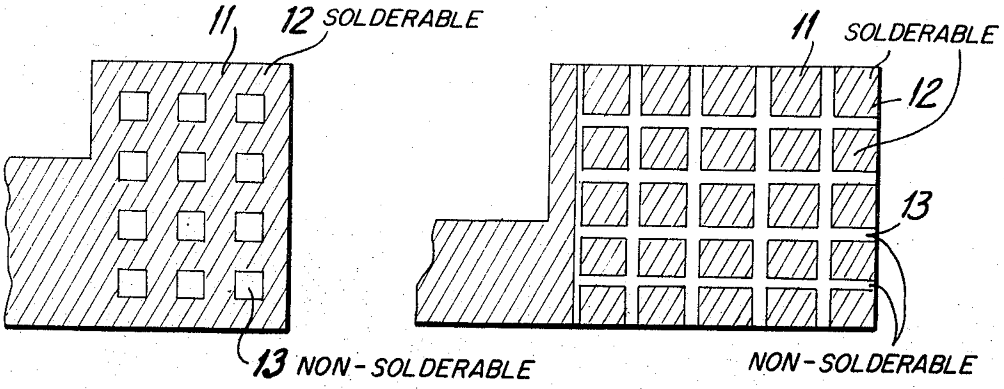
FIGS. 2 (*a*) and (*b*) are plan views on an enlarged scale as compared to that of FIG. 1 illustrating examples of film land patterns according to the present invention.
Figure 3:
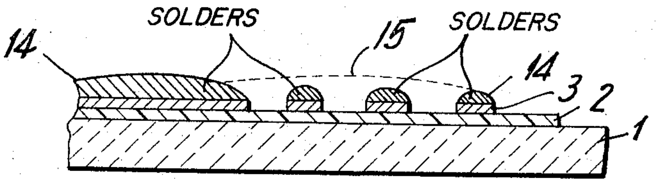
FIG. 3 is a sectional view of a preliminary soldering pattern on film lands according to the present invention.
Figure 4:
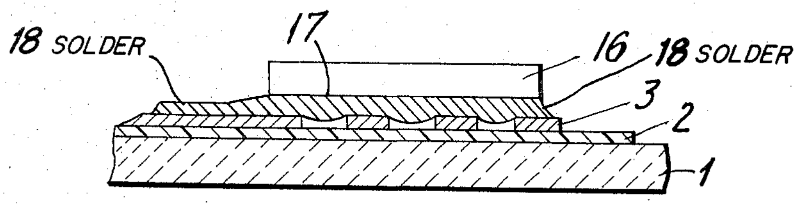
FIG. 4 is a sectional view of a circuit element with a flat plate electrode connected to the film lands according to the present invention.

According to the present invention, as shown in FIGS. 2(*a*), 2(*b*), 3 and 4, the extent of the metal film that has good solderability within the solderable area of a film land 11 is partially reduced according to a predetermined pattern by a suitable method such as photoetching, so as to form on film land 11 solderable areas 12 and non-solderable areas 13, thereby providing preliminary solder 14 on the lands as best shown in FIG. 3. This makes it possible to decrease the amount of solder applied on the film lands as compared with the amount which would be applied by the conventional method as indicated by the broken line 15 of FIG. 3. Although the film land thus formed includes a plurality of isolated solder areas, pressure from the flat plate electrode 16 which is resting on the solder areas will spread out the solder 18 as it is heated over the entire span of the flat plate electrode 17, as shown in FIG. 4, thereby establishing an electrical and mechanical connection with the conductor films 3.

The microcircuit board of the present invention as described has the following advantages in practical applications over the conventional boards:

(1) It is possible to set a desired amount of solder to be applied by preliminary soldering to each of several lands on a microcircuit board by changing the ratio of the solderable areas to the non-solderable areas within each land;

(2) Since preliminary soldering and settlement of the amount of preliminary solder can be accomplished in one wave soldering operation, little melting of the films is caused and hence the bonding force of the solder is substantially unimpaired;

(3) Stable preliminary soldering can be uniformly achieved irrespective of the skill of the operator.

Although the invention has been described in detail with respect to a hybrid integrated circuit board, this invention is also useful for, in general, microcircuit boards including printed circuit boards as well as hybrid circuit boards.

What is claimed is:

1. A microcircuit board comprising a substrate and at least one thin film land formed on said substrate, said thin film land being divided into a plurality of solderable and non-solderable areas, a layer of solder formed on said solderable areas and at least one component, said component including at least one terminal having a substantially planar surface, said substantially planar surface being connected to said layer of solder on at least two of said solderable areas of said at least one land.

2. The microcircuit board of claim 1 in which each of said non-solderable areas on said at least one land is completely surrounded by solderable areas.

3. The microcircuit board of claim 1 in which said solderable areas on said at least one land are separated by a gridlike array of non-solderable areas.

* * * * *